US009503218B2

(12) United States Patent
Nekuii

(10) Patent No.: US 9,503,218 B2
(45) Date of Patent: *Nov. 22, 2016

(54) METHOD AND APPARATUS FOR QUANTIZING SOFT INFORMATION USING NON-LINEAR LLR QUANTIZATION

(71) Applicant: Mehran Nekuii, San Jose, CA (US)

(72) Inventor: Mehran Nekuii, San Jose, CA (US)

(73) Assignee: Cavium, Inc., San Jose, CA (US)

( * ) Notice: Subject to any disclaimer, the term of this patent is extended or adjusted under 35 U.S.C. 154(b) by 123 days.

This patent is subject to a terminal disclaimer.

(21) Appl. No.: 14/493,897

(22) Filed: Sep. 23, 2014

(65) Prior Publication Data
US 2016/0087757 A1    Mar. 24, 2016

(51) Int. Cl.
G06F 13/28    (2006.01)
H04L 1/00    (2006.01)
H03M 13/09    (2006.01)
H03M 13/45    (2006.01)
H03M 13/39    (2006.01)
H03M 13/00    (2006.01)

(52) U.S. Cl.
CPC .......... *H04L 1/0045* (2013.01); *H03M 13/09* (2013.01); *H03M 13/45* (2013.01); *H03M 13/6594* (2013.01); *H03M 13/3927* (2013.01); *H03M 13/6306* (2013.01)

(58) Field of Classification Search
CPC ... H04L 1/0045; H04L 1/005; H04L 25/067; H04L 1/1835; H03M 13/09; H03M 13/6594; H03M 13/6306; H03M 13/45; H03M 13/3927
See application file for complete search history.

(56) References Cited

U.S. PATENT DOCUMENTS 8,472,568 B1 * 6/2013 Fattal ................. H04L 25/067
375/262
9,197,365 B2 * 11/2015 Felix ................... H04L 1/1835

* cited by examiner

*Primary Examiner* — Ernest Unelus
(74) *Attorney, Agent, or Firm* — JW Law Group; James M. Wu

(57) ABSTRACT

A process capable of employing compression and decompression mechanism to receive and decode soft information is disclosed. Upon receiving a set of signals representing a logic value from a transmitter via a physical communication channel, the set of signals is demodulated in accordance with a soft decoding scheme and subsequently, a Log Likelihood Ratio ("LLR") value representing the logic value is generated. After generating a quantized LLR value in response to the LLR value via a non-linear LLR quantizer, the quantized LLR value representing the compressed logic value is stored in a local storage.

15 Claims, 11 Drawing Sheets

METHOD AND APPARATUS FOR QUANTIZING SOFT INFORMATION USING NON-LINEAR LLR QUANTIZATION

RELATED APPLICATION

This application is related to the following co-pending application assigned to the Assignee of the present invention.

a. Application Ser. No. 14/493,865, filed on Sep. 23, 2014, entitled "Method and Apparatus for Improving Data Integrity Using Compressed Soft Information," invented by Nekuii; and b. Application Ser. No. 14/493,953, filed on Sep. 23, 2014, entitled "Method and Apparatus for Quantizing Soft Information Using Liner Quantization," invented by Nekuii.

FIELD

The exemplary embodiment(s) of the present invention relates to telecommunications network. More specifically, the exemplary embodiment(s) of the present invention relates to receiving and processing data stream via a communication network.

BACKGROUND

With rapidly growing trend of mobile and remote data access over a high-speed communication network such as 3G or 4G cellular services, accurately delivering data becomes increasingly challenging and difficult. The high-speed communication network which is capable of delivering information includes, but not limited to, a wireless network, a cellular network, wireless personal area network ("WPAN"), wireless local area network ("WLAN"), wireless metropolitan area network ("MAN"), or the like. While WPAN can be Bluetooth or ZigBee, WLAN may be a Wi-Fi network in accordance with IEEE 802.11 WLAN standards.

A problem, however, associated with transmitting a stream data signal through a network is that the strength of data signals may be affected or degraded due to various different reasons. For example, a physical media channel or wireless transmission channel can introduce noise if many sets of data streams try to use the channel to reach their destination. Traveling distance can also degrade signal strength. To improve accuracy of signal decoding, a conventional approach for more accurate reading of a received signal is to use the soft information. For instance, instead of traditional method of receiving and decoding signals using hard information, such as "1" or "zero", the soft information offers more information about the received signals, such as "strong 1," "relative strong 1," "relative weak 1," "strong 0," "relative strong 0," "relative weak 0," and the like.

A drawback associated with using the soft information is the large size of information that typically requires a larger storage space for storing such information as well as higher bandwidth for transferring such information.

SUMMARY

One embodiment of the present invention discloses an apparatus and/or method which is capable of compressing soft information using a compression mechanism during a decoding process. The process, in one aspect, is able to receive a data stream formatted with soft information from a communication network such as a wireless network. After identifying a set of bits representing a first logic value from a portion of the data stream in accordance with a predefined soft encoding scheme, the set of bits is compressed into a compressed set of bits. The compressed set of bits which represents the first logic value is subsequently stored in a local memory. After retrieving the compressed set of bits representing the logic value from the local memory, the compressed set of bits is forwarded to a decoder. The process activates a decompression process to covert the compressed set of bits to a decompressed set of bits representing the local value. The error correction code ("ECC") decoder activates ECC to determine integrity of the logic value in response to the decompressed set of bits.

Additional features and benefits of the exemplary embodiment(s) of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
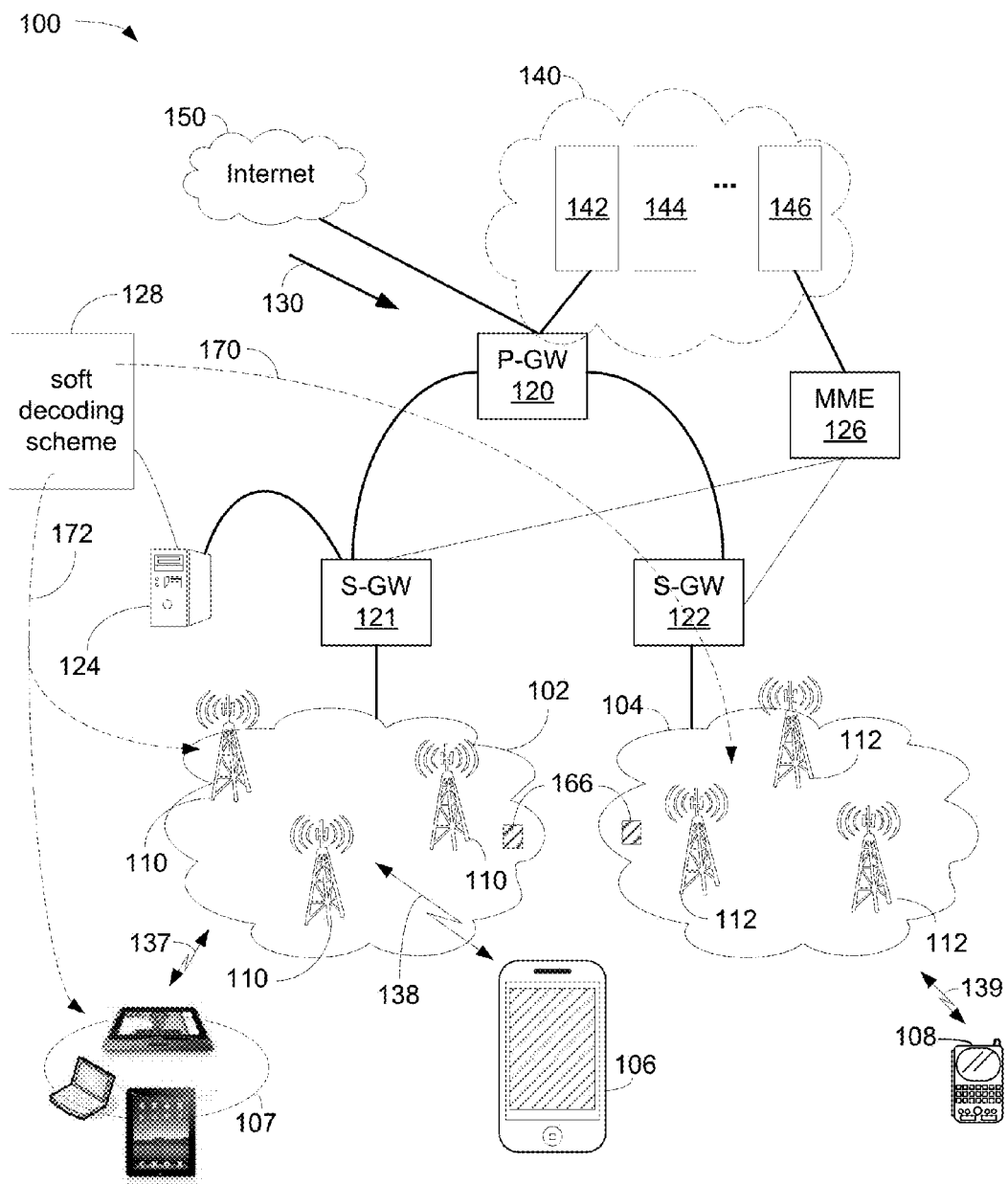
FIG. 1 is a block diagram illustrating a computing network configured to route data streams using a soft information compressor ("SIC") in accordance with one embodiment of the present invention.

Embodiments of the present invention are described here in the context of a method and/or apparatus for improving efficiency in decoding soft information using compression and decompression procedures.

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming, but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

The term "system" or "device" is used generically herein to describe any number of components, elements, sub-systems, devices, packet switch elements, packet switches, access switches, routers, networks, modems, base stations, eNB (eNodeB), computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

IP communication network, IP network, or communication network means any type of network having an access network that is able to transmit data in a form of packets or cells, such as ATM (Asynchronous Transfer Mode) type, on a transport medium, for example, the TCP/IP or UDP/IP type. ATM cells are the result of decomposition (or segmentation) of packets of data, IP type, and those packets (here IP packets) comprise an IP header, a header specific to the transport medium (for example UDP or TCP) and payload data. The IP network may also include a satellite network, a DVB-RCS (Digital Video Broadcasting-Return Channel System) network, providing Internet access via satellite, or an SDMB (Satellite Digital Multimedia Broadcast) network, a terrestrial network, a cable (xDSL) network or a mobile or cellular network (GPRS/EDGE, or UMTS (where applicable of the MBMS (Multimedia Broadcast/Multicast Services) type, or the evolution of the UMTS known as LTE (Long Term Evolution), or DVB-H (Digital Video Broadcasting-Handhelds)), or a hybrid (satellite and terrestrial) network.

A process capable of employing compression and decompression mechanism to receive and decode soft information is disclosed. The process, in one aspect, is able to receive a data stream formatted with soft information from a communication network such as a wireless network. After identifying a set of bits representing a first logic value from a portion of the data stream in accordance with a predefined soft encoding scheme, the set of bits is compressed into a compressed set of bits. The compressed set of bits which represents the first logic value is subsequently stored in a local memory. After retrieving the compressed set of bits representing the logic value from the local memory, the compressed set of bits is forwarded to a decoder. The process activates a decompression process to convert the compressed set of bits to a decompressed set of bits representing the local value. The error correction code ("ECC") decoder activates ECC to determine integrity of the logic value in response to the decompressed set of bits.

FIG. 1 is a block diagram 100 illustrating a computing network configured to route data streams using a soft information compressor ("SIC") in accordance with one embodiment of the present invention. Diagram 100 includes packet data network gateway ("P-GW") 120, two serving gateways ("S-GWs") 121-122, two base stations (or cell sites) 102-104, server 124, and Internet 150. P-GW 120 includes various components 140 such as billing module 142, subscribing module 144, tracking module 146, and the like to facilitate routing activities between sources and destinations. It should be noted that the underlying concept of the exemplary embodiment(s) of the present invention would not change if one or more blocks (or devices) were added to or removed from diagram 100.

The network configuration illustrated in diagram 100 may also be referred to as a third generation ("3G"), 4G, LTE, or combination of 3G and 4G cellular network configuration. MME 126, in one aspect, is coupled to base stations (or cell site) and S-GWs capable of facilitating data transfer between 3G and LTE (long term evolution) or between 2G and LTE. MME 126 performs various controlling/managing functions, network securities, and resource allocations.

S-GW 121 or 122, in one example, coupled to P-GW 120, MME 126, and base stations 102 or 104, is capable of routing data packets from base station 102, or eNodeB, to P-GW 120 and/or MME 126. A function of S-GW 121 or 122 is to perform an anchoring function for mobility between 3G and 4G equipments. S-GW 122 is also able to perform various network management functions, such as terminating paths, paging idle UEs, storing data, routing information, generating replica, and the like.

P-GW 120, coupled to S-GWs 121-122 and Internet 150, is able to provide network communication between user equipment ("UE") and IP based networks such as Internet 150. P-GW 120 is used for connectivity, packet filtering, inspection, data usage, billing, or PCRF (policy and charging rules function) enforcement, et cetera. P-GW 120 also provides an anchoring function for mobility between 3G and 4G (or LTE) packet core network(s).

Base station 102 or 104, also known as cell site, node B, or eNodeB, includes one or more radio towers 110 or 112. Radio tower 110 or 112 is further coupled to various UEs, such as a cellular phone 106, a handheld device 108, tablets and/or iPad® 107 via wireless communications or channels 137-139. Devices 106-108 can be portable devices or mobile devices, such as iPhone®, BlackBerry®, Android®, and so on. Base station 102 facilitates network communication between mobile devices such as UEs 106-107 with S-GW 121 via radio towers 110. It should be noted that base station or cell site can include additional radio towers as well as other land switching circuitry.

Server 124 is coupled to P-GW 120 and base stations 102-104 via S-GW 121 or 122. In one embodiment, server 124 which contains a soft decoding scheme 128 is able to distribute and/or manage soft decoding and/or hard decoding based on predefined user selections. In one exemplary instance, upon detecting a downstream push data 130 addressing to mobile device 106 which is located in a busy traffic area or noisy location, base station 102 can elect to decode the downstream using the soft decoding scheme distributed by server 124. One advantage of using the soft decoding scheme is that it provides more accurate data decoding, whereby overall data integrity may be enhanced.

When receiving bit-streams via one or more wireless or cellular channels, a decoder can optionally receive or decipher bit-streams with hard decision or soft decision. A hard decision is either 1 or 0 which means any analog value greater than 0.5 is a logic value one (1) and any analog value less than 0.5 is a logic value zero (0). Alternatively, a soft decision or soft information can provide a range of value from 0, 0.2, 0.4, 0.5, 0.6, 0.8, 0.9, and the like. For example, soft information of 0.8 would be deciphered as a highly likelihood one (1) whereas soft information of 0.4 would be interpreted as a weak zero (0) and maybe one (1).

Base station 102 or 104, in one aspect, includes a soft information compressor ("SIC") 166 and soft decoder using soft decoding scheme 128. In one aspect, mobile devices such tables or iPad® 107 also use soft decoding scheme 128 to process data. Upon receiving and extracting soft information containing data from received signals using the soft decoding scheme, SIC 166 is able to compress the soft decoding metrics ("SDM") to conserve memory space before storing the compressed SDM in a local memory. SDM is a set of N-bit soft information representing a logic value where N is an integer. When the decoder or soft decoder is ready to decode the received signals, the compressed SDM is fetched from the local memory and forwarded to the soft decoder. After decompressing the compressed SDM, the soft decoder verifies the integrity or accuracy of the data represented by the decompressed SDM based on embedded error correction code ("ECC"). It should be noted that SIC 166 can also reside in other network devices, such as S-GW 121, server 124, or UEs (user equipments).

To improve data integrity, the data, during an operation, is encoded with ECC before transmission. To process received signal(s), the decoder extracts encoded data from the received signals in accordance with a set of N-bit SDM. It should be noted that the N-bit SDM can be logarithmically scaled and/or quantized in order to reduce the memory requirements. To convert back to a linear scale or uncompressed form, the quantized or compressed data can be decompressed before it reaches the input of soft decoder.

An advantage of using a receiver or decoder containing SIC 166 is to conserve memory space as well as conserving network bandwidth.

Figure 2:
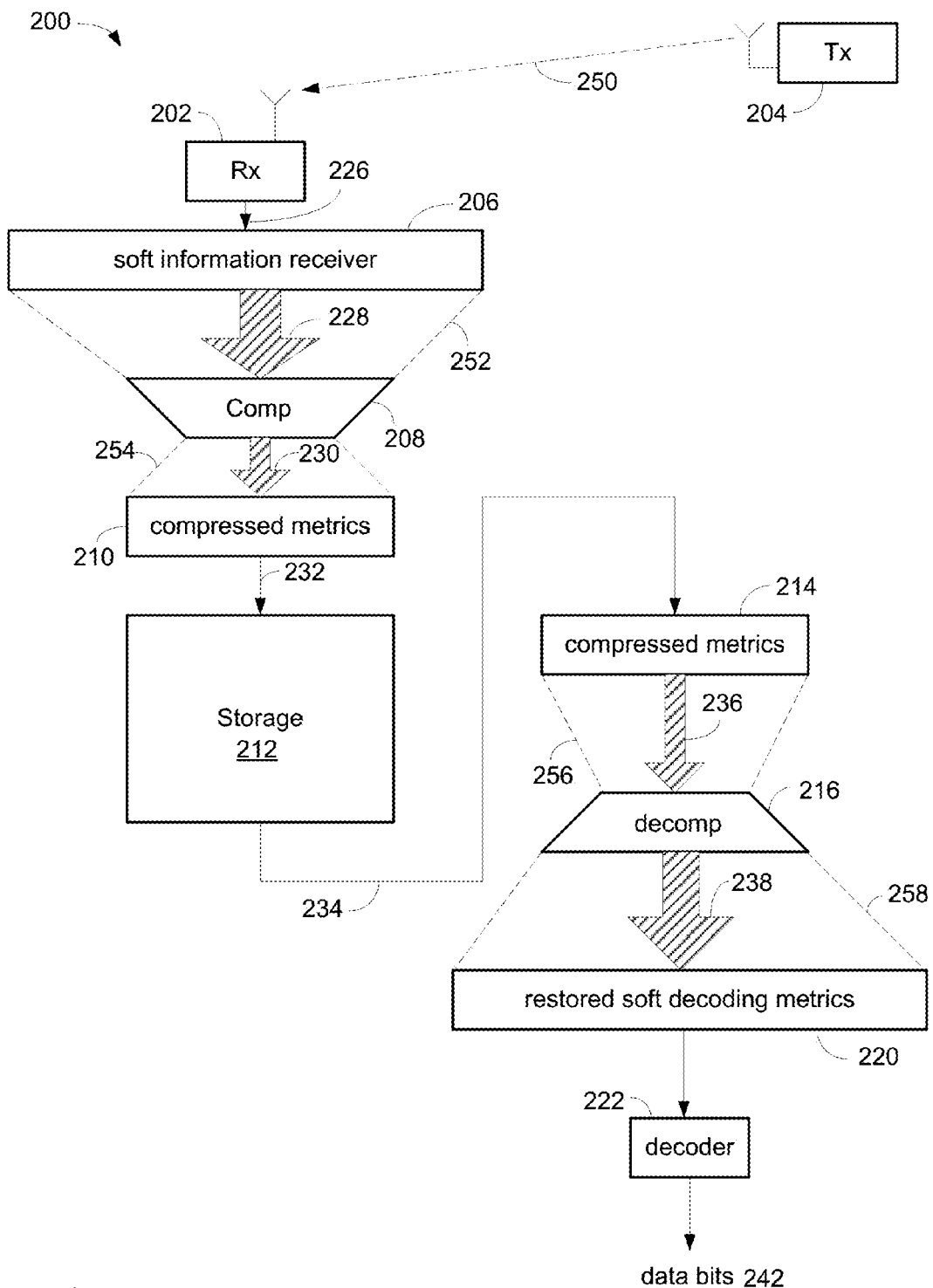
FIG. 2 is a block diagram illustrating an exemplary process of handling soft decoding using SIC in accordance with one embodiment of the present invention.

FIG. 2 is a block diagram 200 illustrating an exemplary process of handling soft decoding using SIC in accordance with one embodiment of the present invention. Diagram 200 illustrates a logic data flow transmitting a bit stream from a transmitter 204 to a receiver 202 via a channel 250. Channel 250, in one example, can be any network communications channel, such as a wireless communication channel, cellular network, landline network channels, or a combination of wireless and landline network channels. It should be noted that the underlying concept of the exemplary embodiment(s) of the present invention would not change if one or more blocks (or steps) were added to or removed from diagram 200.

Upon receipt of stream of data signals 226, a soft information receiver ("SIR") 206 deciphers stream of data signals to a set of N-bit SDM 228 based on the soft decoding scheme. Since SDM 228 are generally several folders larger (or more bits) than hard coding, SDM 228 is forwarded to a compressor 208 to compress SDM 228 to compressed metrics 210. It should be noted that SDM can also be referred to as soft coding metrics. Depending on the applications, the compression can reduce the number of bits as indicated by dash line 252 representing a logic value to a smaller number of bits as indicated by dash line 254 representing the same logic value. After compression, compressed metrics 210 is stored in storage 212 via link 232.

When decoder 222 is ready, a group of compressed metrics 214 is fetched from storage 212 and forwarded to decompressor 216 via links or connections 234-236. After receiving compressed metrics 214 which may be a set of compressed metrics representing one logic value or multiple logic values, decompressor 216 converts or decompresses compressed metrics 214 to restore or decompress SDM 220 via links 236-238. Depending on the applications, the decompression can restore the small number of bits as indicated by dash line 256 to a larger number of bits as indicated by dash line 258 representing the same or similar to the original logic value. After decompression, decoder 222, also can be referred to as ECC decoder, generates data bits 242 based on restored SDM 220.

It should be noted that in a digital communication system, information represented by a set of binary bits is transmitted from transmitter such as Tx 204 to the receiver such as Rx 202 thorough a physical communication channel 250. To protect data integrity from channel impairments, the transmitter such as Tx 204 encodes the data with ECC and transmits modulated signals embodying encoded bits to the receiver such as Rx 202. The receiver demodulates and extracts the encoded bits, decodes the ECC and extract the data such as data bits 242.

To reduce channel impairments due to high-speed traffic and/or noise, decoder such as decoder 222 uses ECC to decode data using SDM, such as Log Likelihood Ratios ("LLRs"). LLR, in one example, is computed using soft demodulating received signal(s). To minimize the impact of high memory requirement for storing the soft decoded bits before reaching decoder 222, SIC is used to compress the LLR values.

In one embodiment, SIC, which may reside in the ECC decoder, is able to compress soft information (e.g., LLR) using a non-linear quantizer before storing the compressed soft information in a storage. The stored soft information is subsequently decompressed before entering the ECC decoder 222. The non-linear quantization can be achieved through taking the logarithm in base n of LLR value and then rounding the result to generate compressed soft information where n is an integer. To simplify forgoing discussion, a logarithm base 2 ("log 2") is chosen. It should be noted that an exemplary compressed LLR can be calculated by taking log 2 of a portion of MSB bits of LLR value.

Alternatively, a partial compression can be used to generate partially compressed soft information calculated by a non-linearly quantizing. To generate partially compressed soft information representing a logic value, a non-linear partial LLR quantizer, in one aspect, applies log 2 of M of least significant bits ("LSB") of the LLR value, and then leaves the remaining bits intact, where M is an integer.

Figure 3:
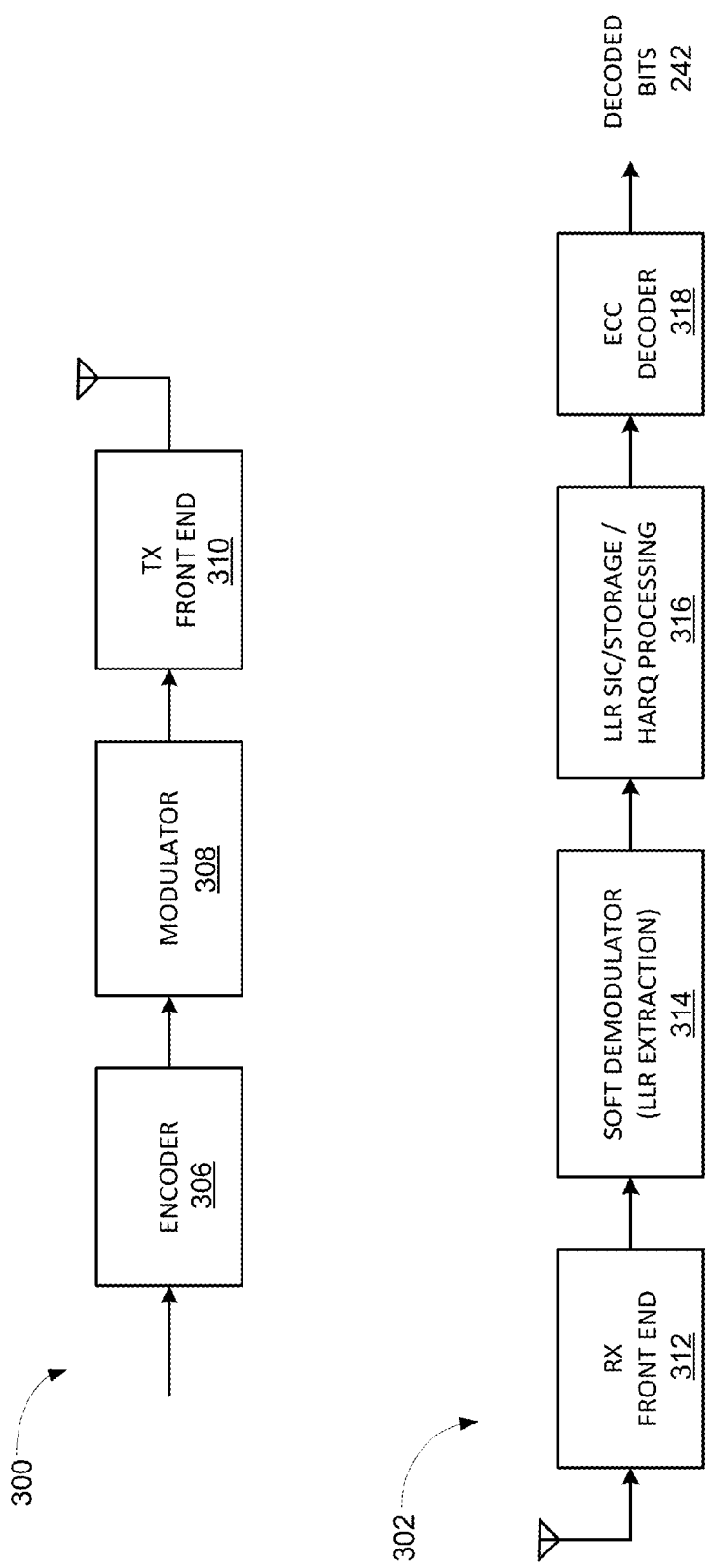
FIG. 3 illustrates two block diagrams showing an encoding and decoding logic flows using soft information in accordance with one embodiment of the present invention.

FIG. 3 illustrates two block diagrams 300-302 showing an encoding and decoding logic flows using soft information in accordance with one embodiment of the present invention.

Diagram 300 illustrating an encoding process includes an encoder 306, a modulator 308, and a transmitter front end 310. Diagram 302 showing a decoding process includes a receiver front end 312, a soft demodulator 314, an LLR processing module 316, and an ECC decoder 318. It should be noted that the underlying concept of the exemplary embodiment(s) of the present invention would not change if one or more blocks (or steps) were added to or removed from diagrams 300-302.

Diagram 300 shows an encoding processing in a wireless communication system, wherein a stream of information bits is encoded using an ECC at encoder 306. ECC and/or other error detections are encoded in the stream of information bits to mitigate potential channel impairments during the transmission. Depending on the applications, encoder 306 can use one of many types of ECCs for error detection, such as turbo encoder, convolution encoder, block codes, and the like. In addition to encoding, interleaving can also be performed on encoded bits to protect adjacent encoded bits from traffic or network noises.

After encoding the stream of information bits with ECC, encoder 306 forwards the ECC encoded information bits to modulator 308. Modulator 308 modulates and/or prepares the encoded bits for transmission. In one example, modulator 308 may be an orthogonal frequency division multiplexing ("OFDM") modulator. Once the encoded bits are modulated, they are forwarded to Tx front end 310 for transmission. The modulated bits are subsequently transmitted via a wireless channel by Tx front-end 310.

Diagram 302 illustrates a logic flow after a stream of information bits or data is received by receiver 312. After receiving signals or information bits, the received signals are forwarded to soft demodulator 314 for LLR extraction. In one aspect, LLR SIC 316 is configured to extract or decipher received signals in accordance with LLR value(s). After extracting the LLR value(s), a compression operation is performed to reduce number of bits representing the logic value(s). After compressing or quantizing, the compressed or quantized LLR value(s) is stored in a local memory. ECC decoder 318 subsequently fetches the compressed LLR value(s) from the local memory, and decompresses or scales back the compressed LLR value(s). After decompressing, decoded bits are generated based on ECC verification in accordance with the decompressed LLR value(s).

It should be noted that a received signal is demodulated and then decoded by the ECC decoder to reconstruct the transmitted information bits or data. A soft decoding scheme(s), which provides superior performance of reading accuracy, is used to obtain SDM in accordance with received signal(s). SDM, in one example, is an indication that likelihood transmitted value is 0, likely 0, likely 1, 1, and the like. Log-likelihood ratio ("LLR") value(s), in one example, is SDM which is subsequently fed to the ECC decoding.

To reduce memory requirement, a method of non-linear scaling and quantizing LLR values can be used to compress the data before storage. The non-linear scaling and quantizing LLR values can also mitigate large bandwidth requirement for transmitting SDM between the local memory and soft ECC decoder. An advantage of employing LLR SIC/storage is to conserve memory as well as bandwidth resources. It should be noted that LLR SIC 316 can also be used to handle the HARQ process associated with soft information.

In a wireless communications network, a network system including a receiver, soft demodulator, non-linear compressor, and storage is capable of transmitting data using soft information. The receiver such as receiver front end 312 is able to receive signals from a wireless or cellular communication network. In one example, the receiver is able to receive bit streams containing video, audio, and data information via a base station. The soft demodulator such as modulator 314 is configured to extract SDM from received signals. In one aspect, the soft demodulator is able to perform LLR functions to obtain the SDM.

The non-linear compressor such as LLR SIC 316 is able to compress a set of SDM representing a logic value to a set of compressed metrics. It should be noted that the number of bits used by the set of compressed metrics is less than number of bits used by the SDM representing the same logic value. For example, the number of bits used by compressed metrics is between 75 percent (%) and 25% of number of bits used by SDM. The non-linear compressor, in one aspect, is a non-linear LLR quantizer which is used to compress data. The storage stores compressed metrics before they are being fetched by the decoder.

The decoder, in one aspect, is configured to fetch the set of compressed metrics from a local memory. Upon arriving at the decoder, the set of compressed metrics is decompressed and restored as decompressed SDM. The decoder, in one example, is an ECC decoder configured to check data integrity associated with restored SDM. The decoder further includes an LLR scale back module which is used to decompress compressed SDM.

Figure 4:
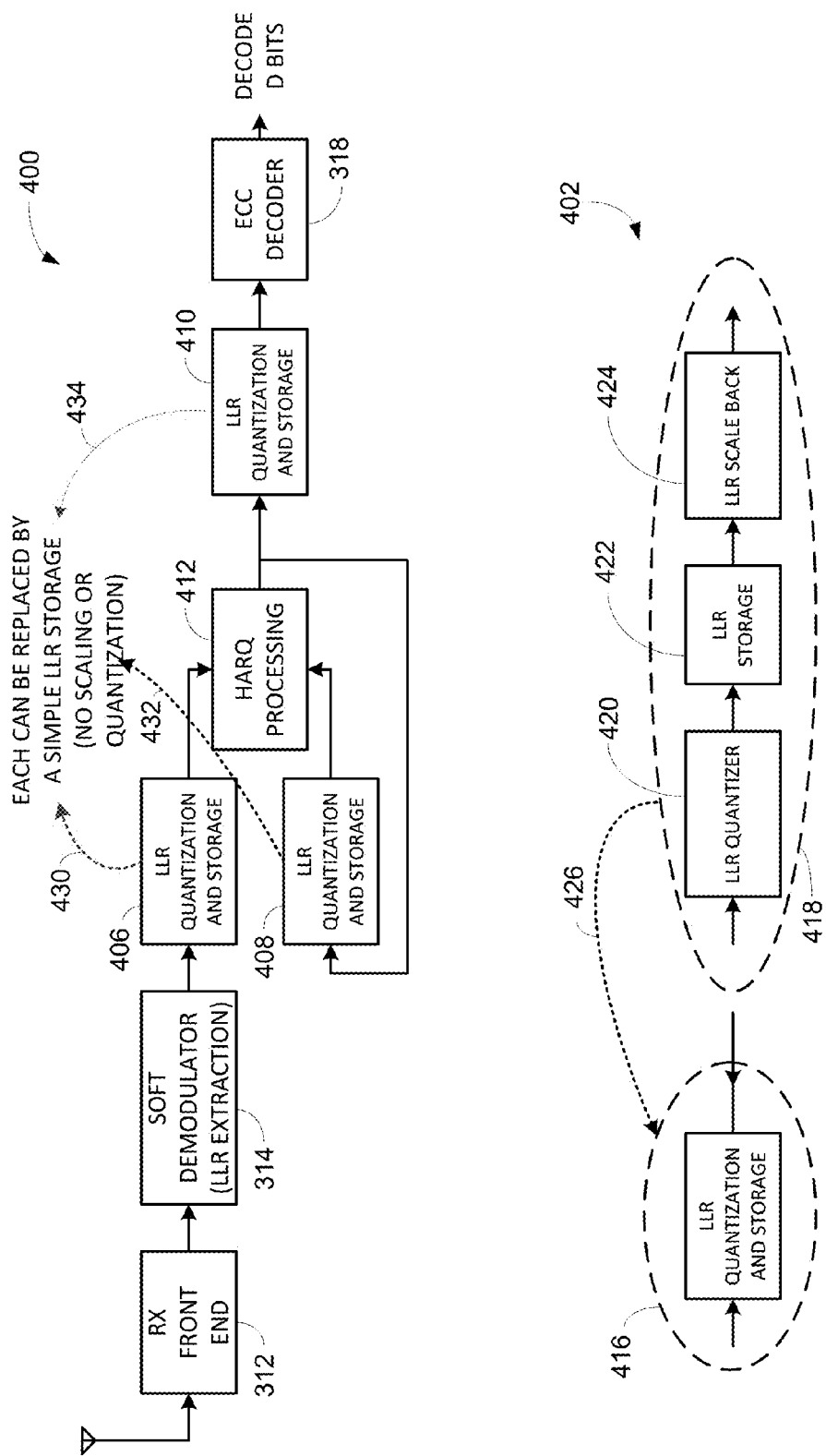
FIG. 4 illustrates block diagrams showing a logic flow for handling a hybrid automatic repeat request ("HARQ") using SIC in accordance with one embodiment of the present invention.

FIG. 4 illustrates block diagrams 400-402 showing logic flows for handling a HARQ using SIC in accordance with one embodiment of the present invention. Diagram 400 illustrating a decoding process includes receiver 312, modulator 314, three non-linear LLR quantization and storages ("NLQSs") 406-410, HARQ processing unit 412, and decoder 318. Diagram 402 illustrates a detailed flow of NLQS showing a compression, storage, and scaling logic process. It should be noted that the underlying concept of the exemplary embodiment(s) of the present invention would not change if one or more blocks (or steps) were added to or removed from diagrams 400-402.

HARQ is a request for resending a corrupted message when an erroneous message is detected. For an automatic repeat request, an error detecting code may be added to data for error detection. HARQ, in one example, uses a forward error correction code which is inserted in data so that if a decoder is capable of performing the forward error correction coding, the error detecting code may be discarded. While HARQ can work in a normal wireless network environment, the automatic repeat request can work more effectively in a poor signal condition. During operation, received corrupted data is generally stored in storage at the receiver and upon receipt of the retransmitted data, the stored corrupted data and the retransmitted data are combined to identify and/or mitigate the data corruptions.

To reduce memory requirement when LLR value(s) is stored for HARQ process such as combining, NLQS 406 or 408 are used to compress the received SDM before storage whereby both storage space and bandwidth are conserved. For example, after receiving a new set of LLRs, the stored non-linearly quantized LLR value is converted back to a linear scale value before being combined (e.g., added). Upon adding or combining, a new LLR value(s) is generated which should identify or correct the corrupted data.

The non-linearly quantized LLR value(s) will be converted back to linear scale before being processed by the ECC decoder. Diagram 400 illustrates an HARQ procedure which is achieved thorough adding redundant bits using an error detecting code such as cyclic redundancy check (CRC). Receiver 312, for example, checks the error detecting code and if the received data is in error, it requests another retransmission of the same data. Better performance is achieved if the bit LLRs of each retransmission is stored in memory so that ECC decoder exploits or combines the stored LLR values with the new and/or retransmitted LLR values. In one aspect, NLQSs 406-410 are capable of reducing LLR bandwidth as well as memory requirements to fix the corrupted data.

In one aspect, a process capable of obtaining network information is able to receive a bit stream containing the SDM from a wireless communication network. After data demodulating at soft demodulator 314, an LLR function(s) is activated to extract the SDM that represents one or more logic values from at least a portion of the bit stream. When the SDM arrives at NLQS 406, a non-linear LLR quantization is activated to perform or compress the SDM to a compressed metrics. The compressed metrics are subsequently stored in a local memory.

Upon receiving retransmitted bit stream such as a second bit stream that contains the second SDM in response to an HARQ issued by HARQ processing unit 412, the LLR function is again activated to extract the second SDM representing a second logic value from at least a portion of the second bit stream. Note that the second logic value is the retransmitted first logic value and they should be the same if no corruption occurs. When the second SDM arrives at NLQS 408, the non-linear LLR quantization compresses the second SDM to a second compressed metrics. The second or retransmitted compressed metrics is subsequently stored in the memory.

After forwarding the first compressed metrics and the second compressed metrics to a decoder such as ECC decoder 318, the first compressed metrics is decompressed and a first decompressed metric is restored. Also, the second compressed metrics is decompressed to generate a second decompressed metric. Decoder 318 activates ECC to combine the first decompressed metrics and the second decompressed metrics to determine and/or improve integrity of the bit stream.

Diagram 402 shows a process of NLQS 418 which operates within logic block 416 as indicated by arrow 426. Upon receipt of a bit stream, non-linear LLR quantizer 420 performs a non-linear LLR quantization to reduce number of bits representing the same or similar value(s) of the original bit stream. After quantization, the LLR quantized value(s) is stored at LLR storage 422. When the compressed or quantized value(s) is ready to be decoded, the compressed value is scaled back or decompressed at LLR scale back module 424.

In one example, NLQS 408 handles the original data stream which contains corruption of data. NLQS 406, on the other hand, quantizes and stores the retransmitted data stream. HARQ processing unit 412, subsequently fetches the original data stream from NLQS 408 and the retransmitted data from NLQS 406. After decompressing both compressed original data stream and retransmitted data, the decompressed original data stream and retransmitted data are combined or added to correct the error. The added data or corrected data stream is subsequently forwarded to NLQS 410 and/or decoder 318.

An advantage of using NLQS is that it mitigates high memory usage as well as high bandwidth usage while the integrity of data transmission is enhanced. It should be noted that either of NLQSs 406-410 or all of NLQSs 406-410 may be replaced by one or more LLR storage as indicated by arrows 430-434.

Figure 5:
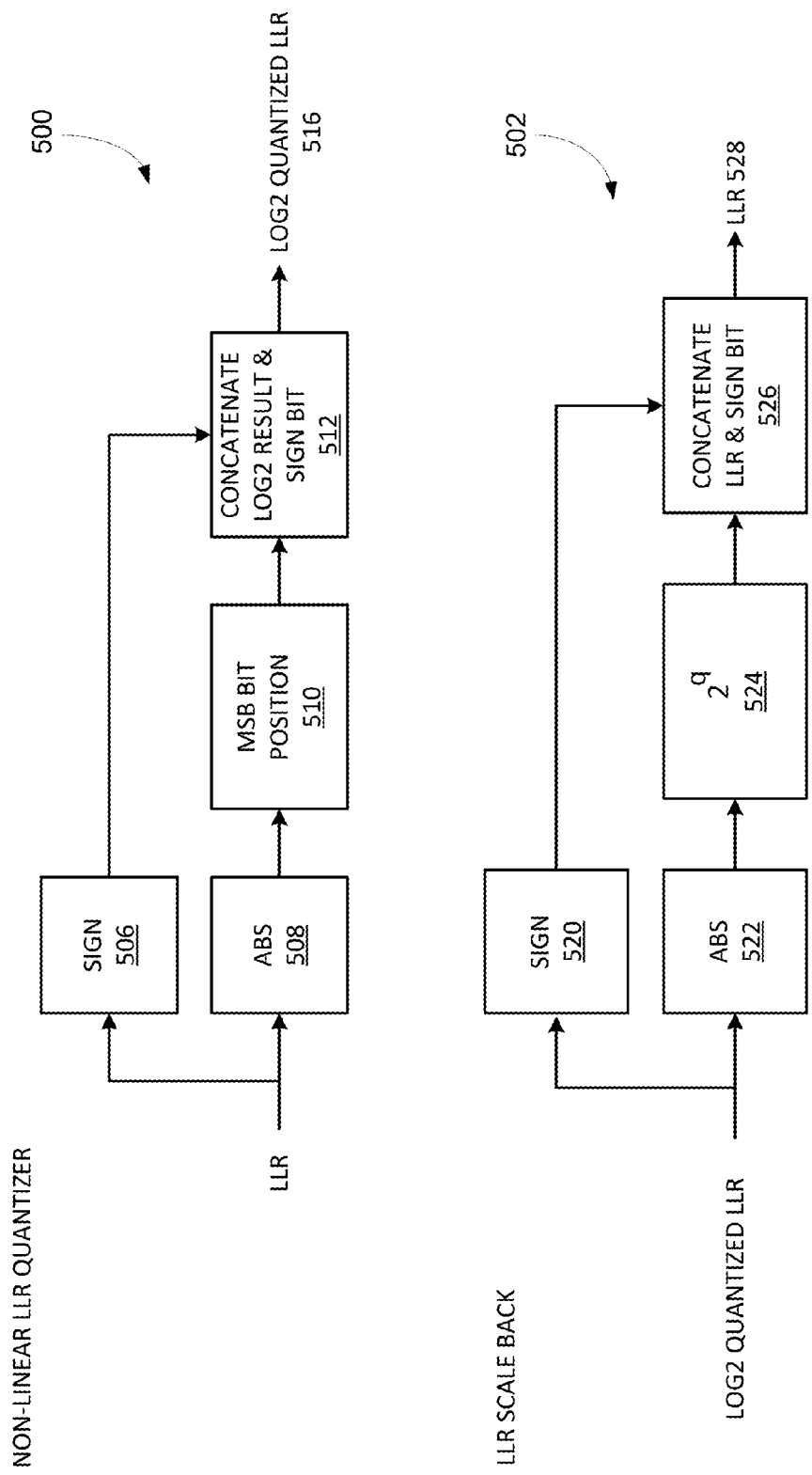
FIG. 5 illustrates block diagrams showing exemplary processes of non-linear LLR quantization and LLR scale back in accordance with one embodiment of the present invention.

FIG. 5 illustrates block diagrams 500-502 showing exemplary processes of non-linear LLR quantization and LLR scale back in accordance with one embodiment of the present invention. Diagram 500 illustrates an exemplary process of generating a log 2 quantized LLR value using a non-linear LLR quantizer for data compression. The LLR value, for example, is soft information such as a set of N-bits SDM used to represent one or more logic values. The term LLR value, LLR, SDM, and soft information may be used interchangeably. In one aspect, the non-linear LLR quantization is implemented in a SIC or compression component in the receiver, such as NLQS. It should be noted that the underlying concept of the exemplary embodiment(s) of the present invention would not change if one or more blocks (or steps) were added to or removed from diagrams 500-502.

Upon receipt of a stream of LLR bits after demodulation, the process of NLQS identifies boundaries between sets of SDM wherein each set of SDM represents a single logic value. Depending on the applications, number of bits used by SDM to represent a logic value may vary. For example, a range of anywhere between four (4) bits and sixty-four (64) is be used by SDM to represent a logic value. If, for instance, the network environment is noisy, a relatively higher number of bits such as 32 bits may be assigned to SDM whereby the integrity of data stream can be enhanced.

After extracting sign bit 506 from the LLR value, the process generates an absolute ("ABS") value 508 based on performing an absolute calculation to the content bits (or remaining bits) of LLR value. A log 2 result 510 is generated by taking a base 2 logarithm or logarithm in a base 2 ("log 2") of ABS value 508. The log 2 operation can be simply performed by obtaining the most significant bit ("MSB") bit position of the ABS value 508. A log 2 quantized LLR value 516 is generated after concatenating the log 2 result with sign bit as indicated by numeral 512.

Diagram 502 illustrates an LLR scale back process capable of decompressing or restoring a compressed value. LLR scale back may be implemented in NLQS. After fetching a log 2 quantized LLR value from a local storage, a sign bit 520 is separated from the log 2 quantized LLR value. After forwarding ABS value 522, a decompressed or restored LLR content is generated by taking a 2 based power of ABS value 524. A restored or decompressed LLR value 528 is calculated by concatenating the decompressed ABS value with sign bit 520 at block 526.

During operation, a network system such as a base station includes a receiver, demodulator, non-linear compressor, and storage. While the receiver is able to receive signals from a transmitter via a wireless communication network, the demodulator deciphers SDM in accordance with LLR calculation. The non-linear compressor subsequently performs a non-linear LLR quantization based on SDM to generate a compressed SDM. The compressed SDM is stored in the storage.

To generate a log 2 quantized LLR value, the non-linear compressor, in one example, concatenates a sign bit 506 with log 2 result wherein the result is calculated by taking a logarithm in a predefined base to SDM. The log 2 quantized LLR value represents a logic value wherein the log 2 quantized LLR value uses fewer bits than the SDM. In an alternative aspect, a non-linear LLR partial quantizer is used to compress SDM. For example, a non-linear partial compressor is able to concatenate a portion of the most significant bits ("MSB") of SDM with a partial log 2 result. To calculate the log 2 partially quantized LLR value, the non-linear LLR partial quantizer takes a logarithm in a predefined base such as 2 to the remaining bits of SDM. The log partially quantized LLR value which represents a logic value uses fewer bits than the SDM. The network system, in one example, further includes an ECC decoder which is able to decode the decompressed SDM to verify integrity of the received logic value.

Figure 6:
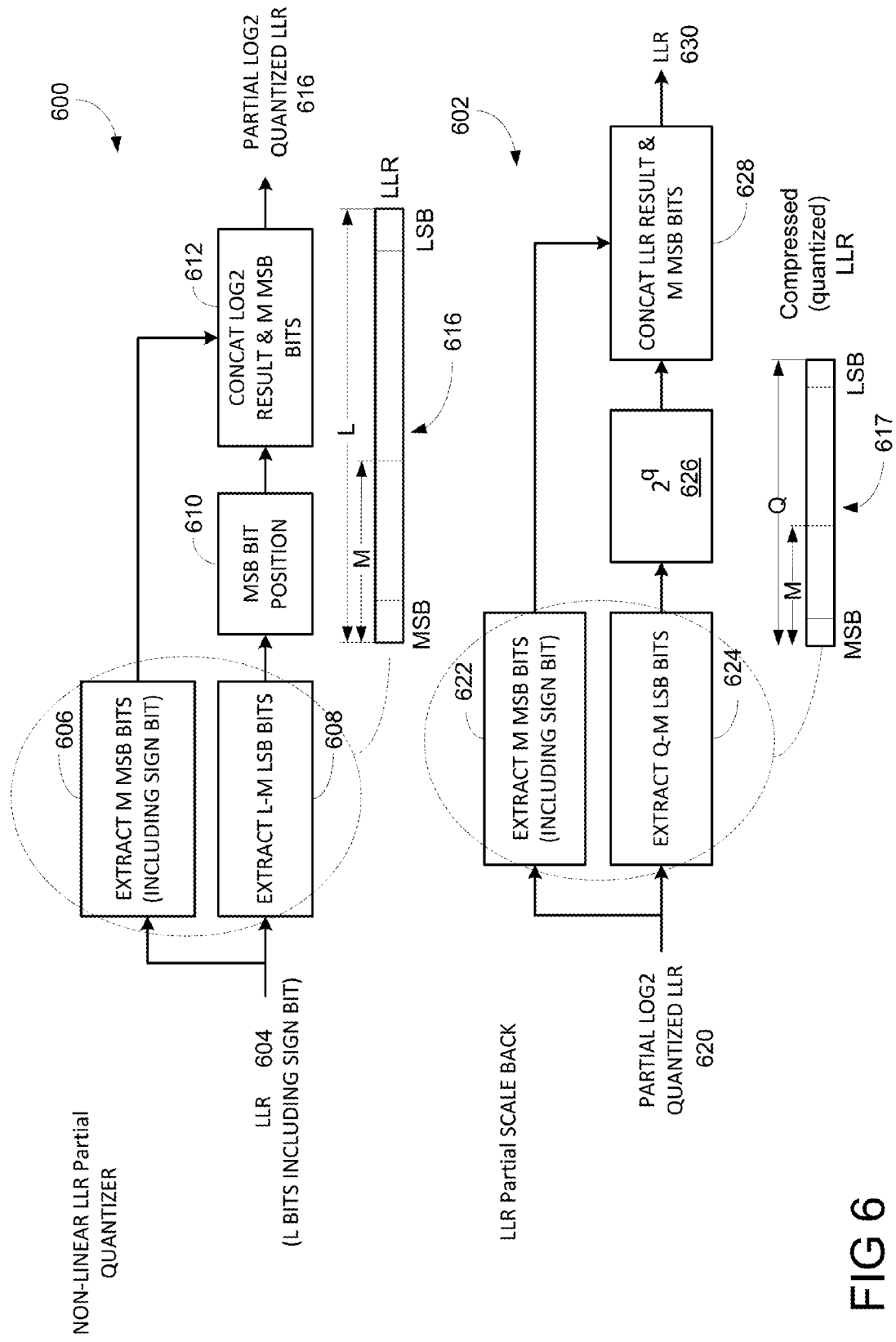
FIG. 6 is a block diagram illustrating an exemplary process of non-linear log likelihood ration ("LLR") partial quantizer in accordance with one embodiment of the present invention.

FIG. 6 is a block diagram illustrating an exemplary process of non-linear LLR partial quantizer in accordance with one embodiment of the present invention. Diagram 600 illustrates an exemplary process of generating a partial log 2 quantized LLR value using a non-linear LLR quantizer for compressing LLR value 604. LLR value 604, for example, is soft information such as a set of L-bits SDM representing a logic value. It should be noted that the underlying concept of the exemplary embodiment(s) of the present invention would not change if one or more blocks (or steps) were added to or removed from diagrams 600-602.

Upon receipt of a stream of LLR bits or value 604 after demodulation, the process of NLQS identifies boundaries between sets of SDM wherein each set of SDM represents a single logic value. A set of SDM uses a range of bits from four (4) to sixteen (16) bits to represent a logic value such as a logic value one (1) or zero (0). LLR 604, in one aspect, includes a total of L bits wherein M indicates a fraction of L bits as shown in block 616, wherein L and M are integers. M, in this example, contains a portion of the most significant bits within L bits of LLR. MSB indicates the most significant bit of LLR and LSB indicates the least significant bit of LLR as shown in block 616.

After extracting a group of most significant positioned bits (M) plus sign bit from LLR value 604 at block 606, the remaining L-M bits which are the least significant positioned bits in L bits of LLR are identified at block 608. If the LLR value is negative, the extraction should happen after performing a 2's complement to extract the L-M bits from the absolute LLR value. A partial log 2 result is computed by taking a log 2 of the L-M bits of the LLR value 604. This is simply the position of the most significant bit of those L-M bits. A partial log 2 quantized LLR value 616 is calculated after concatenating the partial log 2 result with the M MSB bit as block 612. This will result in a compressed LLR value of total Q bits (where Q is less than L) as shown in 602.

Diagram 602 illustrates a process of LLR partial scale back capable of decompressing or restoring a partially compressed value. LLR partial scale back, in one aspect, is implemented in NLQS. After fetching a partial log 2 quantized LLR value 620 from a local storage, M MSB bits are extracted from partial log 2 quantized LLR value 620 at block 622. Quantized LLR value 620, in one aspect, includes a total of Q bits wherein M indicates a fraction of Q bits as shown in block 617, wherein Q and M are integers. After identifying the Q-M LSB bits from partial log 2 LLR value 620, a decompressed or restored partial LLR result is computed by taking a two (2) based power of Q-M LSB bits. A restored or decompressed partial LLR value 630 is calculated by concatenating the decompressed partial LLR result with the M MSB bits at block 628.

In operation, a process of decoding information using SIC and/or NLQS involves receiving a first set of signals representing a first logic value from a transmitter via a physical communication channel. Upon demodulating the first set of signals in accordance with a soft decoding scheme, SDM is extracted or generated in accordance with LLR representing the first logic value. A partially quantized LLR is subsequently generated in response to the LLR via a non-linear LLR partial quantizer. Upon extracting a portion of most significant bits ("MSBs") from the LLR including a sign bit, a log 2 result is computed by taking a logarithm in base 2 of remaining bits of LLR. After concatenating the log 2 result with the portion of MSBs, a partial log 2 quantized LLR is generated. The partially quantized LLR value representing compressed first logic value is stored in a local storage. In one example, storing partially quantized LLR uses less memory space than storing the uncompressed LLR value. After retrieving the partially quantized LLR and sending it to a soft decoder, a decompression or scale back process is activated. For example, upon extracting a portion of MSBs including the sign bit from the partially log 2 quantized LLR, a linear LLR result is calculated by taking 2 based power of the Q-M LSB bits of partial log 2 LLR. LLR 630 is generated by concatenating the LLR result with the M MSB bits of partial log 2 LLR.

Figure 7:
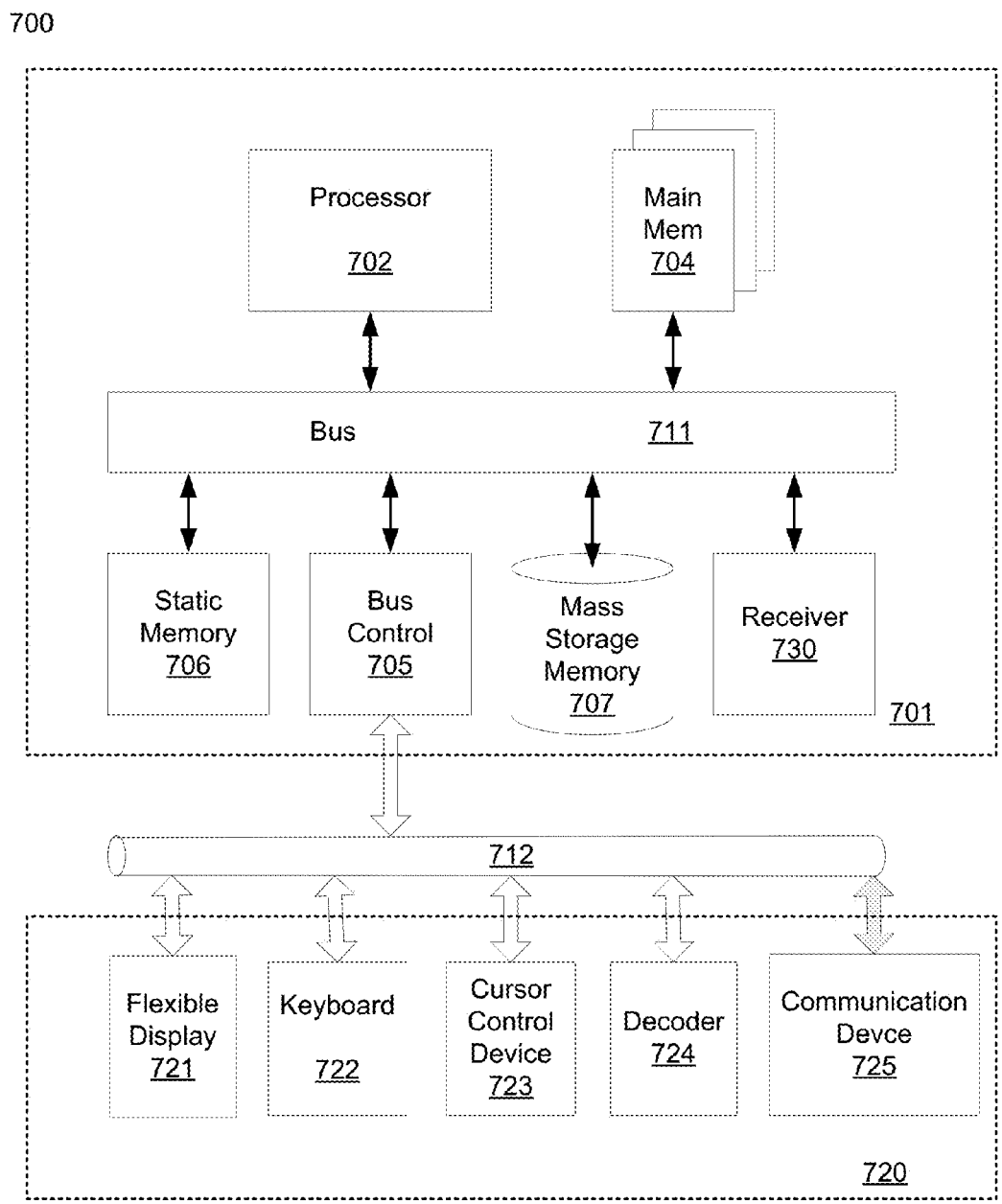
FIG. 7 is a block diagram illustrating an exemplary system capable of providing a SIC operation in accordance with one embodiment of the present invention.

Having briefly described one embodiment of the SIC able to compress SDM before storage, in which the exemplary embodiment of present invention operates, FIG. 7 illustrates an example of a computing system or network system 700, which the features of the present embodiment may be implemented. It will be apparent to those of ordinary skill in the art that other alternative computer system architectures may also be employed.

Computer system 700 includes a processing unit 701, an interface bus 712, and an input/output ("IO") unit 720. Processing unit 701 includes a processor 702, main memory 704, system bus 711, static memory device 706, bus control unit 705, and mass storage memory 707. Bus 711 is used to transmit information between various components and processor 702 for data processing. Processor 702 may be any of a wide variety of general-purpose processors, embedded processors, or microprocessors such as ARM® embedded processors, Intel® Core™2 Duo, Core™2 Quad, Xeon®, Pentium™ microprocessor, AMD® family processors, MIPS® embedded processors, or Power PC™ microprocessor.

Main memory 704, which may include multiple levels of cache memories, stores frequently used data and instructions. Main memory 704 may be RAM (random access memory), MRAM (magnetic RAM), or flash memory. Static memory 706 may be a ROM (read-only memory), which is coupled to bus 711, for storing static information and/or instructions. Bus control unit 705 is coupled to buses 711-712 and controls which component, such as main memory 704 or processor 702, can use the bus. Mass storage memory 707 may be a magnetic disk, solid-state drive ("SSD"), optical disk, hard disk drive, floppy disk, CD-ROM, and/or flash memories for storing large amounts of data.

I/O unit 720, in one example, includes a display 721, keyboard 722, cursor control device 723, web browser 724, and communication device 725. Display device 721 may be a liquid crystal device, flat panel monitor, cathode ray tube ("CRT"), touch-screen display, or other suitable display device. Display 721 projects or displays graphical images or windows. Keyboard 722 can be a conventional alphanumeric input device for communicating information between computer system 700 and computer operator(s). Another type of user input device is cursor control device 723, such as a mouse, touch mouse, trackball, or other type of cursor for communicating information between system 700 and user(s).

Communication device 725 is coupled to bus 211 for accessing information from remote computers or servers through wide-area network. Communication device 725 may include a modem, a router, or a network interface device, or other similar devices that facilitate communication between computer 700 and the network. In one aspect, communication device 725 is configured to perform SIC functions. Alternatively, receiver 730 and communication device 725 perform the SIC functions in accordance with one embodiment of the present invention.

It should be noted that SIC functions can be carried out by hardware, firmware, software, and/or a combination of hardware, firmware, and software.

The exemplary embodiment of the present invention includes various processing steps, which will be described below. The steps of the embodiment may be embodied in machine or computer executable instructions. The instructions can be used to cause a general purpose or special purpose system, which is programmed with the instructions, to perform the steps of the exemplary embodiment of the present invention. Alternatively, the steps of the exemplary embodiment of the present invention may be performed by specific hardware components that contain hard-wired logic for performing the steps, or by any combination of programmed computer components and custom hardware components.

Figure 8:
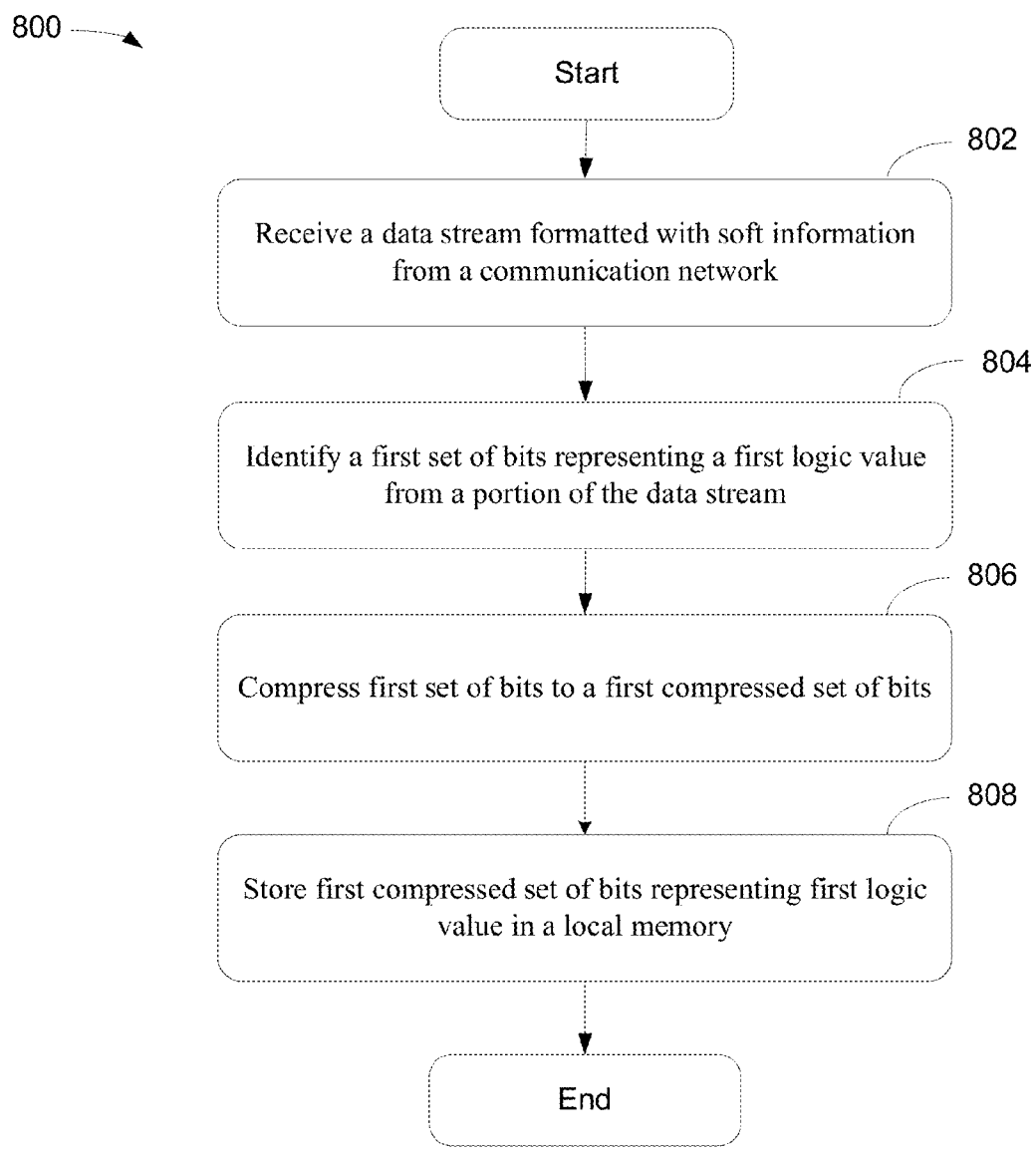
FIG. 8 is a flowchart illustrating a process of compressing soft information using non-linear quantizer in accordance with one embodiment of the present invention.

FIG. 8 is a flowchart 800 illustrating a process such as SIC process able to compress soft information using non-linear quantizer in accordance with one embodiment of the present invention. At block 802, a process capable of receiving information from a network receives a data stream formatted with soft information from a communication network. After modulating the information bits to generate the data stream by an encoder at the transmitter, the data stream is transmitted to a receiver via a wireless communication network. Upon receiving the data stream such as a packet stream capable of carrying video, audio, and data information, the process activates an LLR module to obtain SDM associated with the data stream.

At block 804, a first set of bits representing a first logic value is identified from at least a portion of the data stream in accordance with a predefined soft encoding scheme. In one example, the process is capable of identifying a digital value with eight (8) bits, sixteen (16) bits, or thirty-two (32) bits of soft information.

At block 806, the first set of bits is compressed or quantized to a first compressed set of bits. The process, in one example, is able to compress eight (8) bits soft information representing the first logic value into four (4) bits compressed soft information representing the compressed first logic value.

At block 808, the first compressed set of bits representing the first logic value is stored in a local memory. The local memory, for example, is resided in the receiver and is used to store the first compressed set of bits as they arrive. Alternatively, the compressed LLR value is stored in a local storage at the decoder. After retrieving the first compressed set of bits from the local memory, the first compressed set of bits is forwarded to a decoder. Before entering the decoder, the first compressed set of bits is decompressed, and a first decompressed set of bits is generated. Upon activating the ECC to determine and verify the integrity of the first logic value represented by the first decompressed set of bits, a set of LLR bits representing the intended first logic value is decoded.

Figure 9:
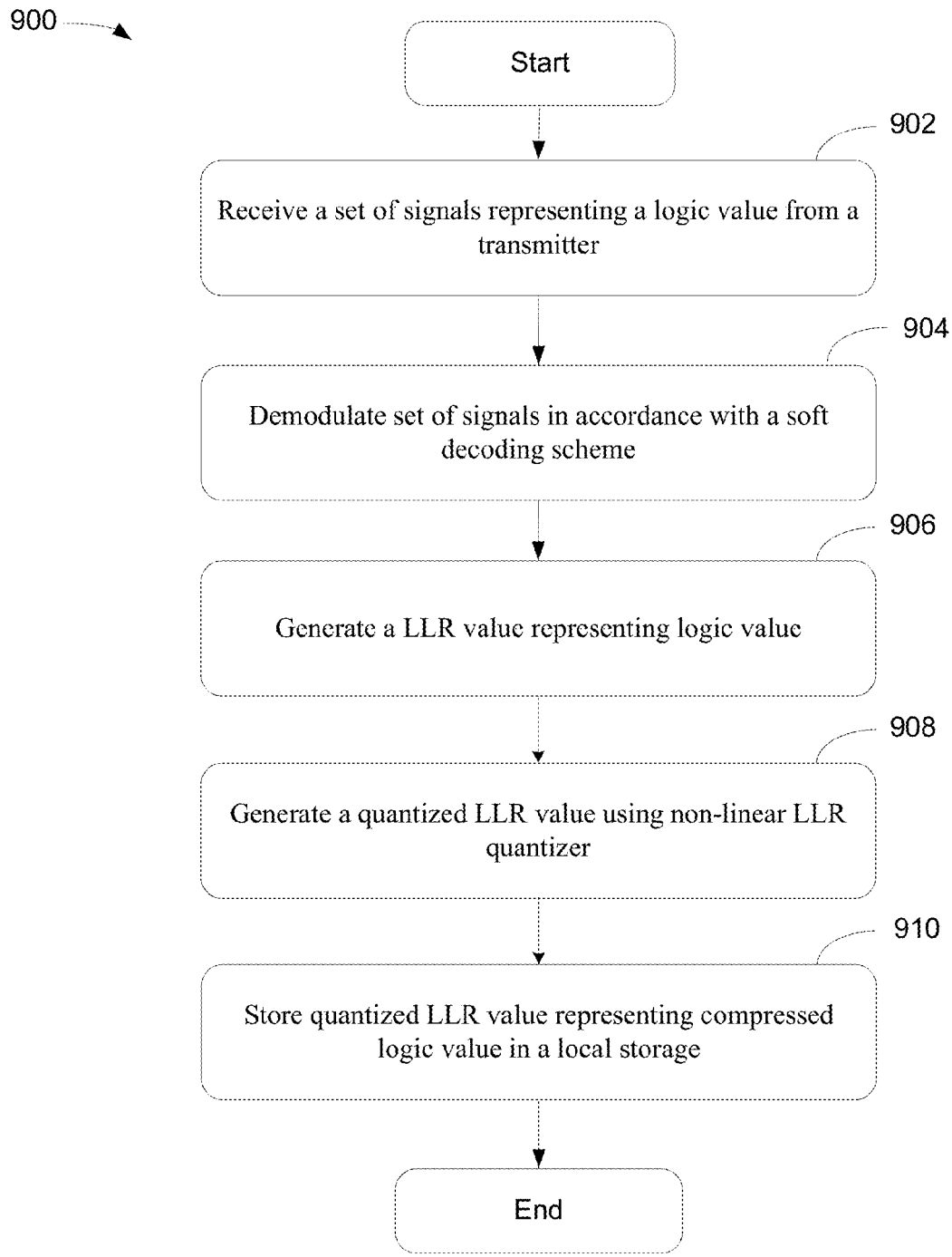
FIG. 9 is a flowchart illustrating a process of performing a quantizing process in accordance with one embodiment of the present invention.

FIG. 9 is a flowchart 900 illustrating a process of performing a quantizing process in accordance with one embodiment of the present invention. At block 902, a process capable of quantizing LLR values receives a first set of signals representing a first logic value from a transmitter via a physical communication channel.

At block 904, the first set of signals is demodulated in accordance with a soft decoding scheme and an LLR value representing the first logic value is generated. At block 906, a quantized LLR value is computed in response to the LLR value via a non-linear LLR quantizer. In one aspect, upon extracting a sign bit from the LLR value, a log or log 2 result is computed by taking a log 2 function for the content bits of LLR value. After concatenating the log 2 result with the sign bit, a log 2 quantized LLR value representing the first logic value is calculated at block 908. At block 910, the log 2 quantized LLR value is stored in a storage, wherein storing the log 2 quantized LLR value requires less memory space than storing the LLR value.

After retrieving the quantized LLR value representing the first logic value from the local storage, the quantized LLR value is forwarded to a soft decoder. Upon extracting the sign bit from the quantized LLR value, an unsigned LLR value is generated by taking two (2) based power of the unsigned quantized LLR value. It should be noted that concatenating the unsigned LLR value with the sign bit can generate a decompressed LLR value.

Figure 10:
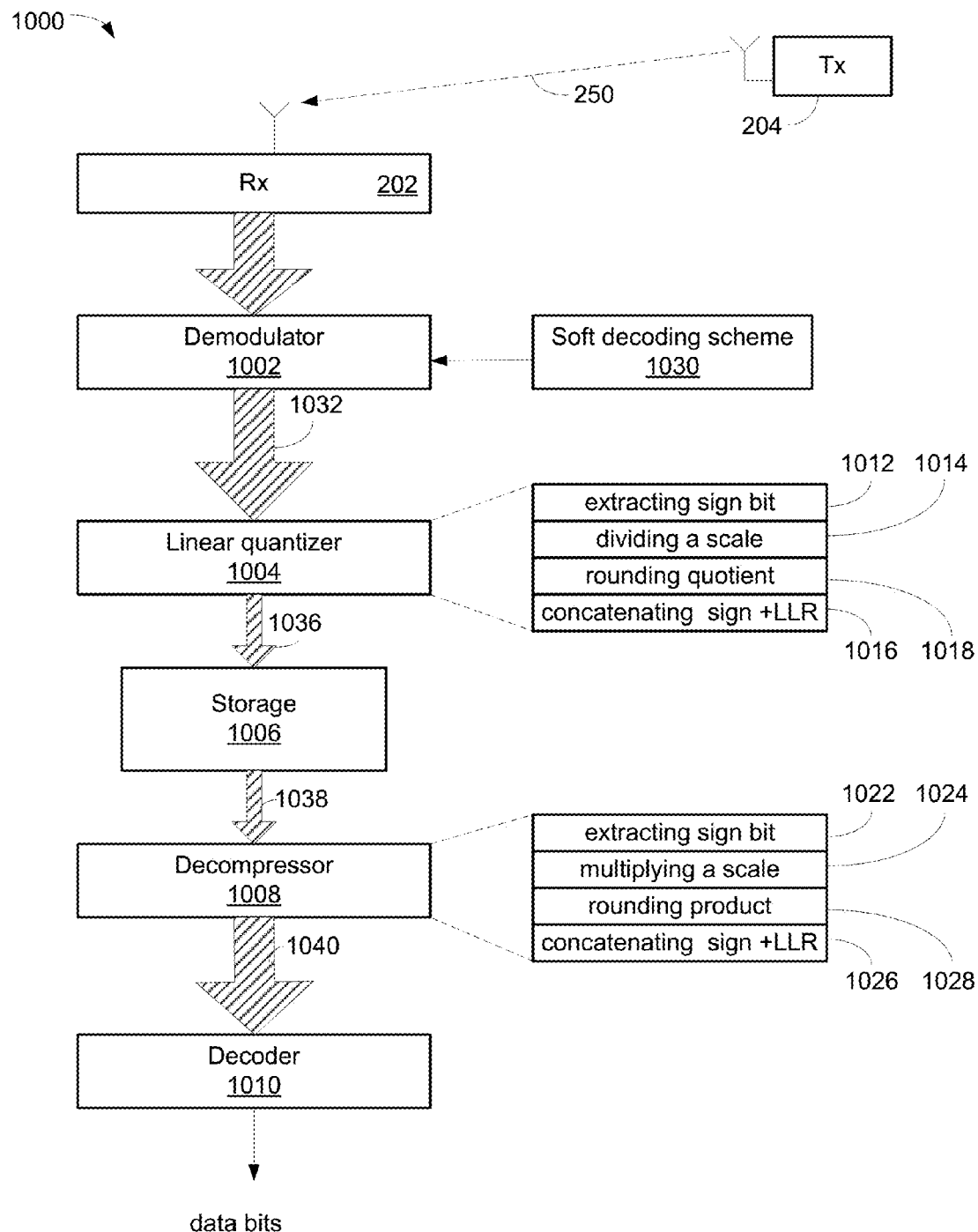
FIG. 10 is a block diagram illustrating an exemplary process capable of handling soft information using a linear quantizer in accordance with one embodiment of the present invention.

FIG. 10 is a logic block diagram 1000 illustrating an exemplary process capable of handling soft information using a linear quantizer in accordance with one embodiment of the present invention. Diagram 1000 illustrates a data transmission sent from transmitter 204 to receiver 202 via channel 250. Channel 250, in one example, can be a wireless communication channel, or a landline network channels. A stream of data bits is subsequently produced by decoder 1010 after the quantization process is implemented. It should be noted that the underlying concept of the exemplary embodiment(s) of the present invention would not change if one or more blocks (or steps) were added to or removed from diagram 1000.

Upon receiving of the bit stream by Rx 202, demodulator 1002 deciphers or translates the bit stream to a set of N-bit SDM 1032 according to soft decoding scheme 1030. Since SDM 1032 is a large set of information bits, it is forwarded to a linear quantizer 1004 to quantize or compress SDM 1032 into a set of compressed metrics or quantized LLR value 1036. Quantized LLR value 1036 uses less number of bits to represent SDM 1032 with loss of accuracy due to quantization. Note that Quantization is a compressing mechanism able to mapping a large set of numbers to a smaller set of values. With a linear quantization, a predefined fixed value is used to scale down number of bits in SDM 1032 for representing one or more logic values.

A scale is referred to as a predefined fixed value or number which may be generated or selected in accordance with number of bits used in SDM for representing a logic value. A linear quantized LLR value, in one embodiment, can be obtained by the following calculation:

LLR_quantized=scale*(round(LLR/scale))

To identify a solution for a 4-bit transmission of LLRs, a linear scale down, for example, can be achieved by a soft demapper which forces the quantized LLR value to a 4-bit value. The quantized LLR, also known as quantized LLR value, is subsequently restored or scaled back at or before arriving to decoder 1010. Note that decoder 1010 can be any types of soft decoder such as turbo decoder. If, for example, the output of soft demapper is 6 bits, the LLR or SDM can be divided by a scale such as a fixed value of 4. The quotient of the division is subsequently quantized or rounded to a predefined number of bits such as 4 bits. After arriving at decode or turbo decoder 1010, the quantized LLR value is multiplied by the scale such as the value of 4 to generate a restored LLR value.

Diagram 1000 illustrates a network system containing receiver 202, demodulator 1002, linear quantizer 1004, local storage 1006, decompressor 1008, and decoder 1010. While receiver 202 is able to receive signals or bit streams from a transmitter via a wireless communication network, demodulator 1002 demodulates the signals based on soft decoding scheme and generates SDM based on LLR calculation for representing the original transmitted signals. Linear compressor or quantizer 1004 generates the compressed SDM or quantized LLR value 1036 using a linear LLR quantization mechanism according to a predefined fixed value. Quantized LLR value 1036 is subsequently stored in local storage 1006.

To generate linear quantized LLR value 1036, linear quantizer 1004 first extracts sign bit 1012 from SDM 1032 and generates unsigned SDM. The unsigned SDM is subsequently divided by a scale such as 4 to generate a quotient. After rounding the quotient to an unsigned result or unsigned LLR 1018, the sign bit and the unsigned result are concatenated 1016 to generate linear quantized LLR 1036.

Decompressor 1008, which can be merged with decoder 1010, is able to retrieve one or more stored quantized LLR values 1038 from local storage 1006 and restore linear quantized LLR value 1038 to decompressed LLR value 1040. Decompressor 1008 multiplies linear quantized LLR value 1038 with the predefined fixed value. In one aspect, after extracting sign bit 1022 from quantized LLR value 1038, the unsigned quantized LLR value is multiplied with the scale such as 4 to restore the decompressed version of unsigned quantized LLR value. After rounding the product of the multiplication, decompressor 1008 concatenates sign bit with the unsigned decompressed LLR value to generate a decompressed LLR value 1040. The decompressed LLR value 1040 is subsequently forwarded to decoder 1010.

In an alternative embodiment, a partial linear quantization can be implemented to provide the quantization of SDM. For example, a process of partial linear quantization is able to receive a set of signals representing a logic value from a transmitter via a wireless communication channel. After demodulating the signals in accordance with a soft decoding scheme, SDM formatted as LLR is generated. After generating a partially quantized LLR via a linear LLR partial quantizer, the partially quantized LLR representing a compressed logic value is stored in a local storage.

To generate a partially quantized LLR, the linear quantizer is capable of extracting an LSB portion of bits from the LLR or SDM. After extracting, the quantized LLR is generated by dividing the LSB portion of bits with a predefined scale value such as 2, 4, 6, or 8. After rounding the quotient to a predefined number of bits, the quantized LLR is concatenated with the MSB portion of LLR (including the sign bit) to produce a partially quantized LLR.

When decoder 1010 is ready to decode new data, the partially quantized LLR representing the logic value 1038 is retrieved from local storage 1006. To decompress the partially quantized LLR, the portion of quantized LSB, in one example, is extracted or separated from the partially quantized LLR. After converting the quantized LLR by multiplying it with the scale value, a decompressed LLR is generated by concatenating the MSB with the portion of LSB. Decoder 1010 decodes data bits based on the decompressed LLR or LLR values.

Figure 11:
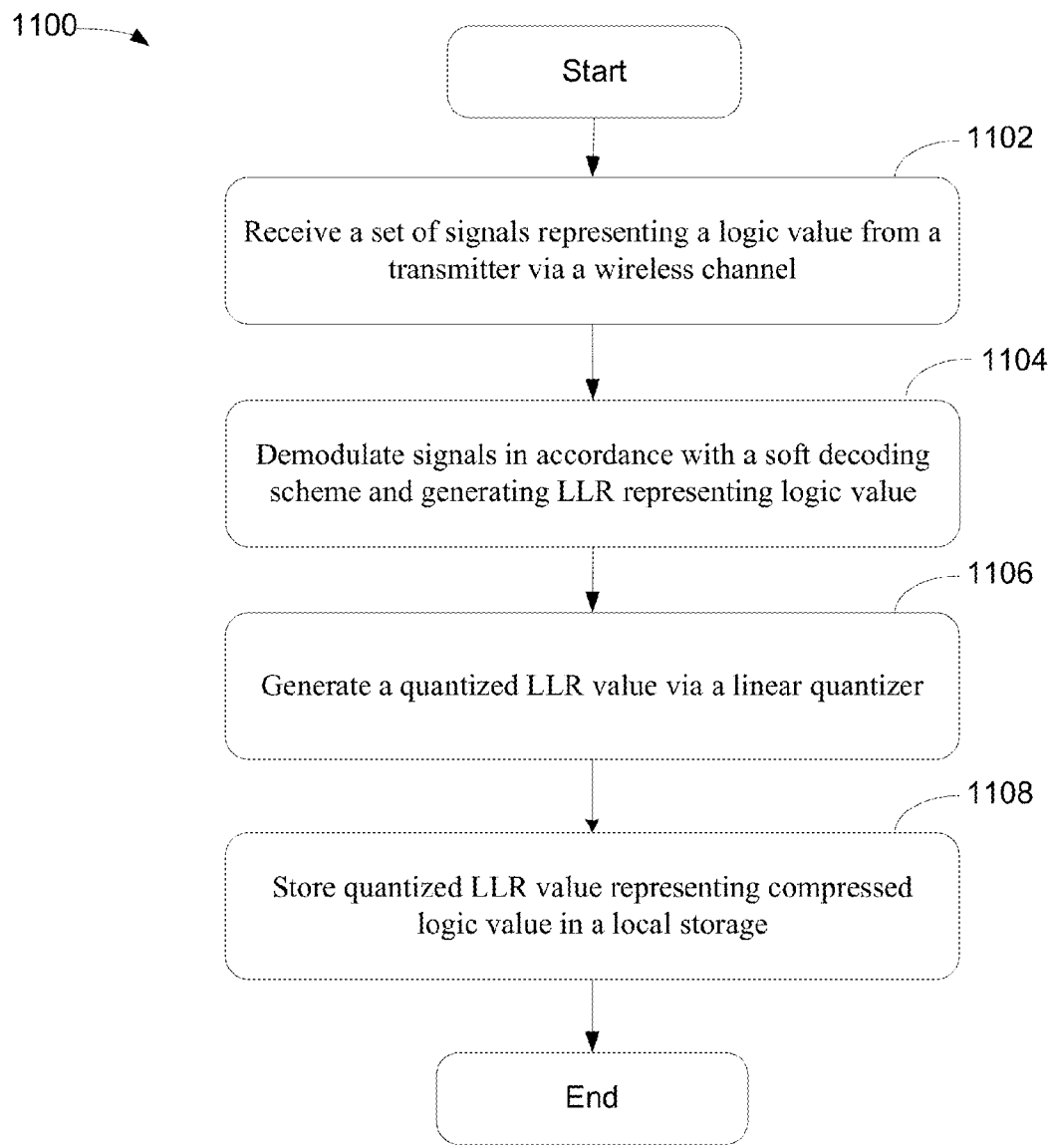
FIG. 11 is a flowchart illustrating a process of compressing soft information using a linear quantizer in accordance with one embodiment of the present invention.

FIG. 11 is a flowchart 110 illustrating a process of compressing or quantizing soft information using a linear quantizer in accordance with one embodiment of the present invention. At block 1102, a process capable of linear quantizing soft information receives a first set of signals representing a first logic value from a transmitter via a communication channel. Note that a second set of signals representing a second logic value can also be received from the transmitter via the same communication channel. The soft information containing multiple bits is used to represent a single logic value.

At block 1104, the first set of signals is demodulated in accordance with a soft decoding scheme and a LLR value representing the first logic value is subsequently generated.

At block 1106, a quantized LLR value is generated by a linear quantizer in response to the LLR value. In one operation, after extracting a sign bit from the content bits of the LLR value, an unsigned LLR value is generated. After the unsigned LLR value is divided by a scale, an unrounded result is generated. Upon calculating an unsigned result via rounding the unrounded result to a predefined number of bits, the quantized LLR is produced by concatenating the unsigned result with the sign bit. It should be noted that the predefined scale can be selected from a set of fixed values based on various factors such as the number of bits used by the soft information to present each logic value.

At block 1108, the quantized LLR value representing the compressed first logic value is stored in a local storage. When soft decoder or decoder is ready for decoding, the stored quantized LLR value is retrieved from the local storage. To decompress the quantized LLR value, the sign bit is first extracted from the quantized LLR value to generate an unsigned quantized LLR value. After multiplying the unsigned quantized LLR value with the scale, a decompressed LLR value or LLR is generated by concatenating the unsigned LLR value with the sign bit. In one aspect, decoder or soft decoder includes the decompressor.

While particular embodiments of the present invention have been shown and described, it will be obvious to those skilled in the art that, based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A method for processing information over a network, comprising: receiving a first set of signals representing a first logic value from a transmitter via a physical communication channel; demodulating the first set of signals in accordance with a soft decoding scheme and generating a Log Likelihood Ratio (LLR) value representing the first logic value; generating a quantized LLR value in response to the LLR value via a non-linear LLR quantizer; storing the quantized LLR value representing compressed first logic value in a local storage; and retrieving the quantized LLR value from the local storage and decompressing the quantized LLR value to restore the LLR value when a decoder is ready to decode the LLR value, wherein generating a quantized LLR value further includes extracting a sign bit from content bits of the LLR value, generating a log result of content by taking a logarithm in base 2 (log 2) of the content bits of the LLR value, and concatenating the log result with the sign bit to produce a log 2 quantized LLR value representing the first logic value.

2. The method of claim 1, wherein concatenating the log result with the sign bit to produce a log 2 quantized LLR value includes storing the log 2 quantized LLR value in a storage, wherein storing the log 2 quantized LLR value requires less memory space than storing the LLR value.

3. The method of claim 1, comprising retrieving the quantized LLR value representing the first logic value from the local storage.

4. The method of claim 3, comprising forwarding the quantized LLR value to a soft decoder.

5. The method of claim 4, further comprising, extracting the sign bit from the quantized LLR value to generate an unsigned quantized LLR value; and generating an unsigned LLR value by taking two (2) based power of the unsigned quantized LLR value.

6. The method of claim 5, further comprising includes concatenating the unsigned LLR value with the sign bit to produce a decompressed LLR value.

7. A method for processing information over a network, comprising: receiving a first set of signals representing a first logic value from a transmitter via a physical communication channel; demodulating the first set of signals in accordance with a soft decoding scheme and generating soft decoding metrics coded in a Log Likelihood Ratio (LLR) representing the first logic value; generating a partially quantized LLR in response to the LLR via a non-linear LLR partial quantizer; storing the partially quantized LLR representing compressed first logic value in a local storage; and retrieving the partially quantized LLR from the local storage and decompressing the partially quantized LLR to restore the LLR when a decoder is ready to decode the first logic value, where generating a partially quantized LLR further includes extracting a portion of most significant bits (MSBs) from the LLR including a sign bit, generating a log based 2 (log 2) result by taking a logarithm in base 2 of remaining bits of the LLR, and concatenating the log 2 result with the portion of MSBs to produce a partial log 2 quantized LLR.

8. The method of claim 7, wherein concatenating the log 2 result with the portion of MSBs includes storing the partially quantized LLR in a storage, wherein storing the partially quantized LLR requires less memory space than storing the LLR.

9. The method of claim 7, comprising retrieving the partially quantized LLR representing the first logic value from the local storage.

10. The method of claim 9, comprising forwarding the partially quantized LLR to a soft decoder.

11. The method of claim 10, further comprising, extracting the portion of MSBs including the sign bit from the partially log 2 quantized LLR; and converting a log 2 result to linear value of least significant bits (LSBs) by taking 2 based power of the log 2 result.

12. The method of claim 11, further comprising concatenating the linear value of LSBs with the portion of MSBs to produce a decompressed LLR representing the first logic value.

13. A network system, comprising: a receiver configured to receive signals from a transmitter via a wireless communication network; a demodulator coupled to the receiver and configured to obtain soft decoding metrics (SDM) based on the signals received by the receiver in accordance with log likelihood ratio (LLR) calculation; a non-linear compressor coupled to the demodulator and able to perform a non-linear LLR quantization to generated compressed SDM in accordance with the SDM; a storage couple to the non-linear compressor and able to store the compressed SDM, and a decode coupled to the storage and configured to fetch and decompress the compressed SDM when the decode is ready to decode the SDM, wherein the non-linear compressor is configured to concatenate a portion of most significant bits (MSB) of SDM with a result that is calculated from taking a logarithm in a predefined base of remaining bits of SDM for producing a log partially quantized LLR value, wherein the log partially quantized LLR value representing a logic value uses less bits than the SDM.

14. The system of claim 13, wherein the non-linear compressor is configured to concatenate sign bit of SDM with a result of taking logarithm in a predefined base of the SDM to generate a log quantized LLR value, wherein the log quantized LLR value represents a logic value uses less bits than the SDM.

15. The method of claim 13, further comprising an error correction code (ECC) decoder coupled to the storage and able to decompress the compressed SDM to check integrity of the logic value.

* * * * *